US008140465B2

(12) United States Patent
Brockbank et al.

(10) Patent No.: US 8,140,465 B2
(45) Date of Patent: Mar. 20, 2012

(54) APPARATUS AND METHOD FOR MONITORING AND CONTROLLING A DEVICE UNDER TEST

(75) Inventors: Ian Bowman Brockbank, Edinburgh (GB); Ricky Wong, Glasgow (GB); William Brian Fallon, Edinburgh (GB); Martin David Twigg, Edinburgh (GB); Nicholas Roche, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 1111 days.

(21) Appl. No.: 12/007,007

(22) Filed: Jan. 4, 2008

(65) Prior Publication Data

US 2008/0216007 A1    Sep. 4, 2008

(30) Foreign Application Priority Data

Jan. 30, 2007   (GB) .................................. 0701733.8

(51) Int. Cl.
G06F 15/18    (2006.01)
G06F 15/00    (2006.01)
(52) U.S. Cl. ......................................................... 706/62
(58) Field of Classification Search .................. 706/62
See application file for complete search history.

(56) References Cited

U.S. PATENT DOCUMENTS

| | | | |
|---|---|---|---|
| 6,466,007 B1 * | 10/2002 | Prazeres da Costa et al. | 324/762.02 |
| 6,756,777 B2 * | 6/2004 | Prazeres da Costa et al. | 324/762.02 |
| 7,512,845 B2 * | 3/2009 | Kim | 714/718 |
| 7,934,134 B2 * | 4/2011 | Forlenza et al. | 714/733 |
| 2002/0109726 A1 | 8/2002 | Rogers et al. | |

FOREIGN PATENT DOCUMENTS

JP   2001-75695   3/2001

OTHER PUBLICATIONS

Test responses compaction in accumulators with rotate carry adders, Rajski, J.; Tyszer, J.; Computer-Aided Design of Integrated Circuits and Systems, IEEE Transactions on vol. 12, Issue: 4 Digital Object Identifier: 10.1109/43.229736 Publication Year: 1993, pp. 531-539.*

* cited by examiner

Primary Examiner — Michael B Holmes
(74) Attorney, Agent, or Firm — Dickstein Shapiro LLP

(57) ABSTRACT

An apparatus is provided for monitoring and controlling a device under test, the device under test comprising a plurality of registers, each register having a register value and comprising a plurality of data bits for controlling a setting or settings of the device under test. The apparatus comprises display means for displaying an interactive register map to a user. The interactive register map is configured to display a plurality of register values simultaneously, and further adapted to display one or more data fields corresponding to each register value, each data field relating to one or more of the data bits and having a first indicator for representing a corresponding device setting. In this manner, a user can readily appreciate which device settings are controlled by the same register value, and hence can be written simultaneously.

50 Claims, 9 Drawing Sheets

| REGISTER | B 15 | B 14 | B 13 | B 12 | B 11 | B 10 | B 9 | B 8 | B 7 | B 6 | B 5 | B 4 | B 3 | B 2 | B 1 | B 0 |
|---|---|---|---|---|---|---|---|---|---|---|---|---|---|---|---|---|
| R0 (00h) | 0 | 0 | 0 | 0 | 0 | 0 | 0 | LRIN BOTH | LIN MUTE | | | | LINVOL | | | |
| R1 (02h) | 0 | 0 | 0 | 0 | 0 | 0 | 1 | RLIN BOTH | RIN MUTE | 0 | 0 | | RINVOL | | | |
| R2 (04h) | 0 | 0 | 0 | 0 | 0 | 1 | 0 | LRHP BOTH | LZCEN | | | | LHPVOL | | | |
| R3 (06h) | 0 | 0 | 0 | 0 | 0 | 1 | 1 | RLHP BOTH | RZCEN | | | | RHPVOL | | | |
| R4 (08h) | 0 | 0 | 0 | 0 | 1 | 0 | 0 | 0 | SIDEATT | | SIDETONE | DAC SEL | BY PASS | INSEL | MUTE MIC | MIC BOOST |
| R5 (0Ah) | 0 | 0 | 0 | 0 | 1 | 0 | 1 | 0 | 0 | 0 | 0 | HIPOR | DAC MU | DEEMPH | | ADC HPD |
| R6 (0Ch) | 0 | 0 | 0 | 0 | 1 | 1 | 0 | 0 | PWR OFF | CLK OUTPD | OSCPD | OUTPD | DACPD | ADCPD | MICPD | LINEIN PD |
| R7 (0Eh) | 0 | 0 | 0 | 0 | 1 | 1 | 1 | 0 | BCLK INV | MS | LR SWAP | LRP | IWL | | FORMAT | |
| R8 (10h) | 0 | 0 | 0 | 1 | 0 | 0 | 0 | 0 | CLKO DIV2 | CLKI DIV2 | | SR | | | BOSR | USB/NORM |
| R9 (12h) | 0 | 0 | 0 | 1 | 0 | 0 | 1 | 0 | 0 | 0 | 0 | 0 | 0 | 0 | 0 | ACTIVE |
| R15 (1Eh) | 0 | 0 | 0 | 1 | 1 | 1 | 1 | | | | | RESET | | | | |
| | | | ADDRESS | | | | | | | | | DATA | | | | |

Fig. 4

APPARATUS AND METHOD FOR MONITORING AND CONTROLLING A DEVICE UNDER TEST

BACKGROUND OF THE INVENTION

1. Field of the Invention

The present invention relates to an evaluation apparatus and method, and in particular to an apparatus and method for monitoring and controlling a device under test, for example an electronic device.

2. Description of the Related Art

Manufacturers of electronic devices often provide evaluation tools for use by their engineers and their customers. These tools enable engineers to monitor and control an electronic device during a system design. When testing and evaluating electronic devices in this way, engineers require the ability to change various settings on a Device Under Test (DUT). Engineers may also need to retrieve and monitor the current settings.

There are a number of different scenarios where this is required. FIG. 1 shows an example of a first scenario in which a DUT 1 is placed on an evaluation board 3 and controlled using a separate computer 5. The evaluation board 3 has appropriate supporting circuitry and components that allow the operation and performance of the DUT 1 to be evaluated. In this scenario control software running on the computer 5 communicates with the DUT 1 via a communications link 7 (for example a USB, serial or parallel communications link). In practice some form of additional interface is also provided, for converting signals received from the computer 5 into signals that the DUT 1 can process. Typical communication interfaces for devices under test include AC'97, I²C, I²S or SPI. This scenario is typically used during the initial evaluation of a DUT 1 (and also during development) to debug problems and work out how to achieve the best operation and performance from the DUT 1.

FIG. 2 shows a second scenario in which the DUT 1 is installed on some form of development platform 9 that also includes all the processor(s), memory, controllers and other components and devices necessary to develop a full system. In this case the control software is running on the development platform and communicating with the DUT directly via one or more interfaces, (for example AC'97, I²C, I²S or SPI as mentioned in the first scenario). This type of arrangement is typically used during system development in order to help get a whole system up and running, including all of the hardware, software and drivers necessary for full development. The development platform 9 is also used for debugging problems that occur when integrating the different components of the system. Once fully debugged and working, the development platform 9 will typically be used as a reference platform for one or more customer applications (i.e. mass-market products).

According to a third scenario shown in FIG. 3 the DUT 1 is installed in a customer application 11 that also includes all the processor(s), memory, controllers and other components and devices necessary for a full system. In this case the control software is running on the customer application and communicating with the DUT directly via one or more appropriate interfaces (for example AC'97, I²C, I²S or SPI as mentioned above). This scenario is typically used by a customer once a customer's application has been developed from a reference design, for debugging integration issues which occur during the development of the application.

The devices under test are controlled using registers which have an n-bit address (typically 6, 7 or 8 bits) and an n-bit data value (typically 8, 9 or 16 bits). The data values consist of one or more data fields, each data field comprising one or more data bits for controlling various aspects of the DUT. The data values may also comprise one or more null bits which have no effect on the DUT.

FIG. 4 illustrates an example of a register map having ten control registers R0-R9 plus a reset register R15. These registers comprise an address portion having seven address bits B9-B15 and a data portion comprising nine data bits B0-B8:

The first register R0 is shown as having three data fields: a 5-bit-wide field called "LINVOL" (from data bits B4 to B0) and 2 single-bit fields called "LIN MUTE" (data bit B7) and "LRIN BOTH" (data bit B8). The first register R0 also has 2 null bits corresponding to bits B5 and B6.

As will be appreciated by a person skilled in the art, a register must always be written completely. In other words, it is not possible to update only certain data fields or bits within the register. This means that, if only one data field or data bit of the register is to be changed, the remainder of the register must also be rewritten with its current value. For example, if the status of the data field "LIN MUTE" at data bit B7 of the first register R0 requires changing, for example by writing a "0" to data bit B7, while leaving the other data bits at their current values, then the only way to achieve this is to ascertain the current values for each of the other data bits in register R0, reset data bit B7 (i.e. set B7 to 0) and write the adjusted data value back to the register R0.

Some devices support a read-back of a current value in a register, thus allowing an engineer to read the current value, make the modifications required and write the updated value back again with confidence. This is known as a "read-modify-write" operation.

However, other devices only support writing to the registers. Such systems require engineers to remember or store the last-written value for each register, so that this value is ready for use when making subsequent updates. Since the last-written value is stored on the host CPU (or "cached"), a situation can arise where the device under test holds a register value which is different to that stored in the cache, for example if another application has written to the device independently, or if the device has been reset to default values without also resetting the cached values. Such cached values are therefore less trustworthy than values which have been read directly from the device.

Furthermore, on devices which support read-back, some values are read-only and cannot be modified by the software running on the host CPU. Typically, these are status fields or the results of analogue-to-digital conversions monitoring external voltage levels (e.g. battery voltage level). Some devices have registers in which the data fields exhibit a mixture of access types—read-only, write-only and read-write.

Registers which contain a mixture of write-only and read-write fields are particularly difficult to handle. To make a change to the settings held in such a register, the engineer must remember the value they last wrote to the device for the write-only bits, combine it with the value read from the device for the readable bits, make the desired changes, then write the new value back to the device register. For example, consider a device register where the whole 16 data bits control various aspects of the device, but only data bits 15-8 can be read back. Also, assume that the last value written to the register was 0x4372, and that the data field at bits 15-12 can be updated by the device and now holds value 0x5. If an engineer wishes to set data bit 7, then the engineer has to perform the following steps for updating the partially readable register:

| Action | Value |
| --- | --- |
| Read the current value from the register | 0x5300 |
| Retrieve the stored last write value | 0x4372 |
| Mask off the readable bits | 0x0072 |
| Combine the two values to obtain the real current value | 0x5372 |
| Set bit 7 (0x0080) | 0x53F2 |
| Write the new value to the register | 0x53F2 |

As will be appreciated from the above, a user has to monitor several aspects when controlling registers in a device under test. Therefore, when making changes to register values, it would be desirable to know how data bits correspond to data fields, which data fields can be modified and which can be trusted. Also, when performing debugging operations, it is particularly important to be aware of which settings have been read from the device and can be trusted, and which settings have come from a cache and hence may be incorrect. It is also useful to know what settings have been changed from the default start-up configuration of the device, as this information can be used to narrow down the area where problems are likely to exist. In addition, when developing control software sequences, an engineer needs to know what settings have been written so the setting can be duplicated in their software sequence.

FIG. 5 shows a known evaluation tool 51 for assisting engineers when monitoring and controlling a device under test. The evaluation tool 51 comprises a panel of controls, which allow the settings of the device under test to be controlled in a reasonably intuitive manner. For example, control element 53 allows the "LEFT MUTE" setting to be controlled, control element 55 allows the power-down settings to be controlled, and so on.

Although such a system has the benefit of making the settings easy for the engineer to interpret and update, the panel of controls does not convey how the various settings relate to the actual register values. As a result, it is difficult to set up the panel to match a set of register settings from a failing system. Furthermore, there is no way of determining which settings are inter-dependent, i.e. need to be written simultaneously because they are located in the same register.

Other disadvantages of this type of system include not being able to determine whether changes made to settings through the panel have actually been submitted to the device. In other words, although it becomes clear when a control element such as "LEFT MUTE" 53 has been changed on the control panel, this does not confirm if the updated setting of "LEFT MUTE" has been submitted to the device under test. This system also has the disadvantages of not being able to identify default settings (hence being unable to identify what has changed), and not being able to retrieve current settings for use in control software. Furthermore, an engineer can easily forget that the current settings may not reflect those of the device (e.g. because the device is write-only). The software for complex devices also needs to be organised into multiple control panels, thus preventing a quick overview of the state of the whole device under test.

FIG. 6 shows another known evaluation tool, which allows a register to be specified and then either written or read. The control panel 61 comprises a register index 63, which presents the register value as both checkboxes 65 corresponding to individual data bits of the register, and the complete register value 67. Although this system allows all data bits in a register to be controlled individually, there is no indication of what register data bits mean and how they relate to data fields. Furthermore, it is only possible to work on one register at a time, and there is no indication of whether the register value matches the device. In addition, it is not possible to determine default settings, and hence what has been changed.

Other types of evaluation tools are also known for providing alternative methods of allowing an engineer to monitor and control register values in a device under test. However, these tools all suffer from the disadvantages of being unable to relate device settings to register values, and being unable to determine which settings are inter-dependent (thus requiring simultaneous writing because they are located in the same register).

It is an aim of the present invention is to provide an apparatus and method of monitoring and controlling a device under test, which does not suffer from the disadvantages mentioned above.

SUMMARY OF THE INVENTION

According to a first aspect of the present invention, there is provided an apparatus for monitoring and controlling a device under test, the device under test comprising a plurality of registers, each register having a register value and comprising a plurality of data bits for controlling a setting or settings of the device under test. The apparatus comprises a display for displaying an interactive register map to a user, wherein the interactive register map is configured to display a plurality of register values simultaneously, and wherein the register map is further adapted to display one or more data fields corresponding to each register value, each data field relating to one or more of the data bits and having a first indicator for representing a corresponding device setting.

In this manner, a user can readily appreciate which device settings are controlled by the same register value, and hence can be written simultaneously.

According to a second aspect of the present invention, there is provided a method of monitoring and controlling a device under test, the device under test comprising a plurality of registers, each register having a register value and comprising a plurality of data bits for controlling a setting or settings of the device under test. The method comprises the steps of: displaying an interactive register map to a user, wherein the interactive register map is configured to display a plurality of register values simultaneously, and wherein the register map is further adapted to display one or more data fields corresponding to each register value, each data field relating to one or more of the data bits and having a first indicator for representing a corresponding device setting.

BRIEF DESCRIPTION OF THE DRAWINGS

For a better understanding of the invention, and to show more clearly how it may be carried into effect, reference will now be made, by way of example only, to the following drawings in which:

FIG. 4 illustrates a register map for a typical electronic device;

DETAILED DESCRIPTION OF THE PREFERRED EMBODIMENTS

Figure 1:
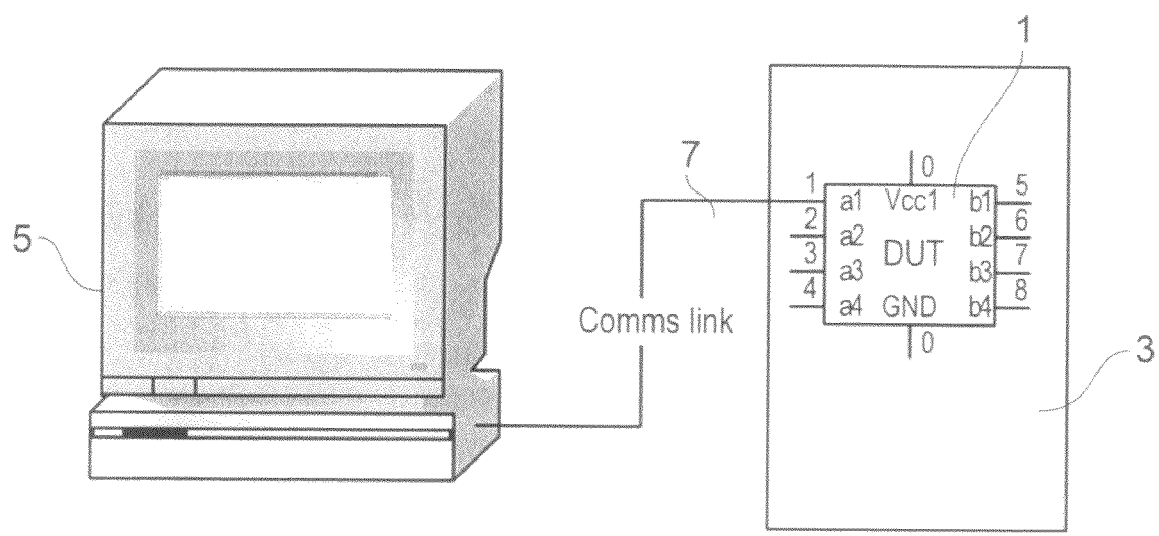
FIG. 1 shows a typical scenario for testing a device using an evaluation board controlled from a separate computer.
Figure 2:
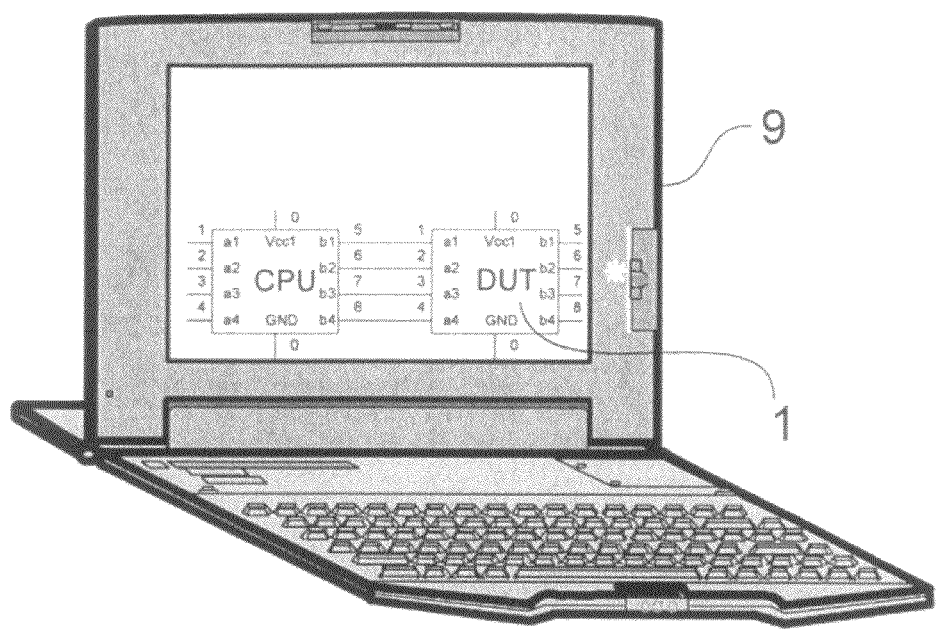
FIG. 2 shows a typical scenario for testing a device using a development platform.
Figure 3:
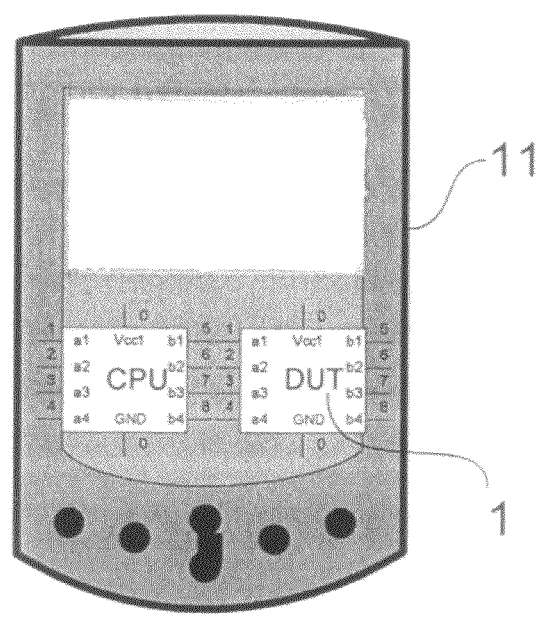
FIG. 3 shows a typical scenario for testing a device using a development platform installed in a customer application.
Figure 5:
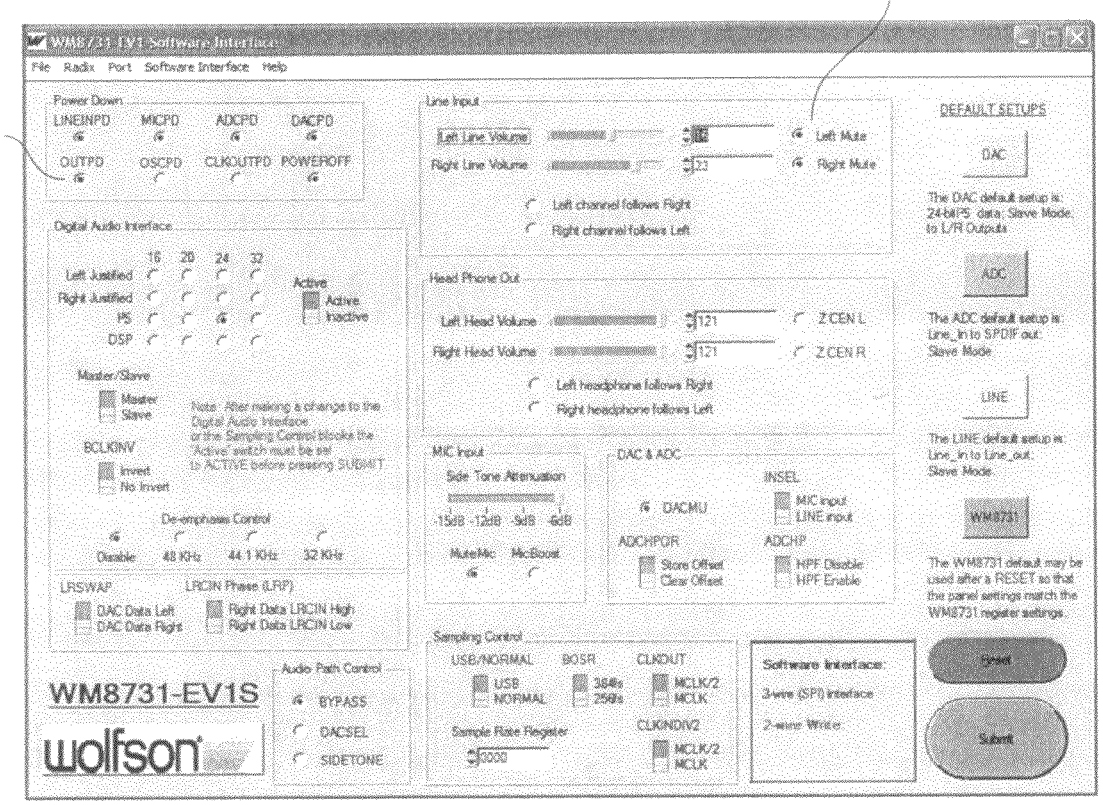
FIG. 5 illustrates a control panel of an evaluation tool according to a first known system.
Figure 6:
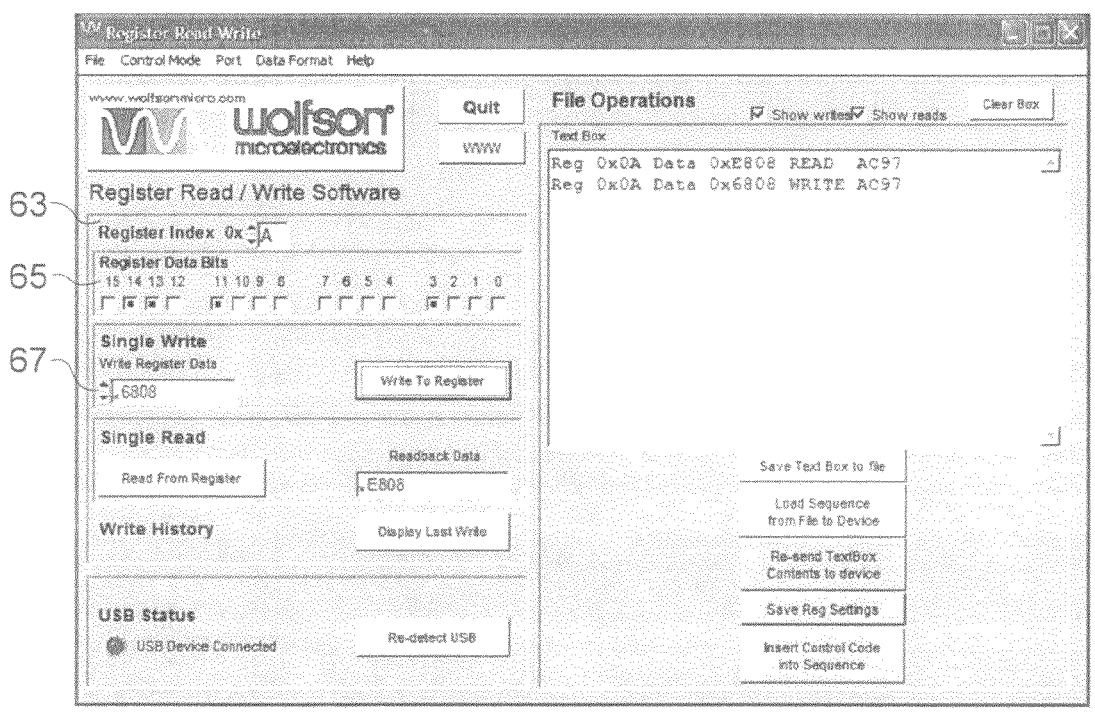
FIG. 6 illustrates a control panel of an evaluation tool according to a second known system.
Figure 7:
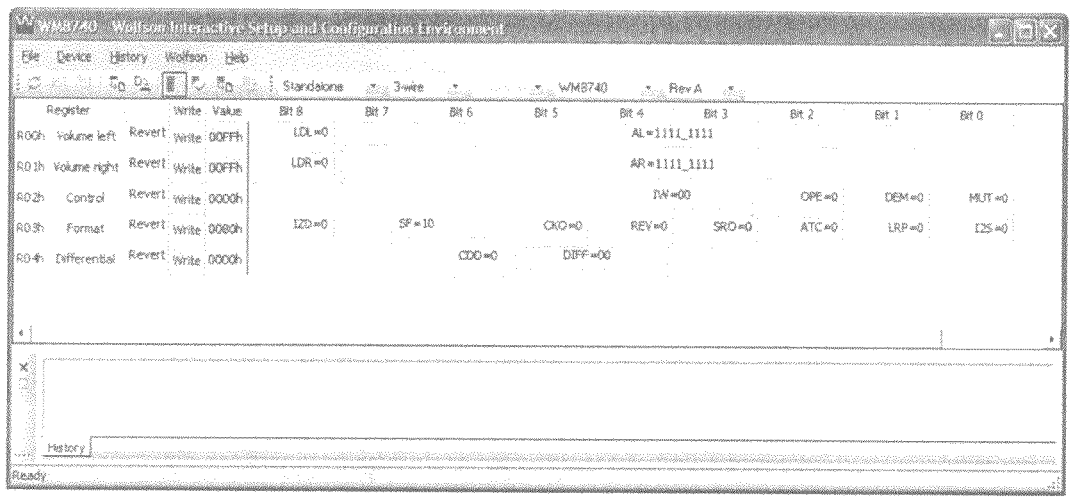
FIG. 7 shows an interactive register map according to a first aspect of the present invention.

FIG. 7 illustrates an example of an apparatus for monitoring and controlling a device under test according to a first aspect of the present invention. For illustrative purposes only, the device under test is shown as device number WM8740, comprising five registers R00h, R01h, R02h, R03h and R04h. According to this first aspect of the present invention, the apparatus displays an interactive register map showing a plurality of registers simultaneously, preferably all five registers. The interactive register map indicates the register value for each register. Furthermore, the interactive register map is adapted to provide an indication of the data field or data fields associated with a particular register value. Each data field comprises one or more data bits, the one or more data bits corresponding to data bits used for controlling a corresponding device setting on the device under test.

For example, the register value for register R03h is used to control the device settings "IZD", "SF", "CKO", "REV", "SRO", "ATC", "LRP" and "I2S". As such, the interactive register map illustrates the register value for register R03h (e.g. "0080h" as shown in FIG. 7), and also provides a first indicator for each data field, e.g. "IZD", "SF", "CKO", "REV", "SRO", "ATC", "LRP" and "I2S". In this manner, a user can readily appreciate which device settings are controlled by the same register value, and hence can be written simultaneously.

In the example of FIG. 7 each register value comprises nine data bits, B0-B8. The plurality of data bits are arranged into one or more data fields according to how many bits are required for controlling a particular device setting. For example, register R03h comprises seven single-bit data fields (i.e. "IZD", "CKO", "REV", "SRO", ATC, LRP and "I2S"), and one two-bit data field "SF" (i.e. corresponding to bits B6 and B7 of R03h).

Device settings that are controlled by a single data bit, (e.g. "IZD", "CKO", "REV", "SRO", "ATC", "LRP" and "I2S"), can be represented using toggle switches or buttons. This enables a user to switch between first and second states of a device setting by moving a pointing device (for example a cursor) over the toggle button, and selecting the toggle button to change states (for example by clicking a mouse).

Device settings that are controlled by two or more data bits, (e.g. "SF"), can be represented by a slider switch. This enables a user to change the device setting by moving the slider switch using the cursor and mouse.

Other device settings, for example a setting that is selected from a set of predetermined values, can be represented as a "list box" or drop-down menu that provides a user with a list of options relating to that setting.

As indicated in the background section, when a user wishes to change a particular setting, the user does not know whether the new value has been written to the device, or whether the new value is still waiting to be written. According to a further aspect of the invention, a data field comprises a secondary indicator for displaying status information relating to whether or not the new value has been written to the corresponding register of the device under test. As such, a data field has a first indicator for indicating the device setting corresponding to that particular data field, and a second indicator for indicating whether the value for that data field has been written to the device under test.

Figure 8A:
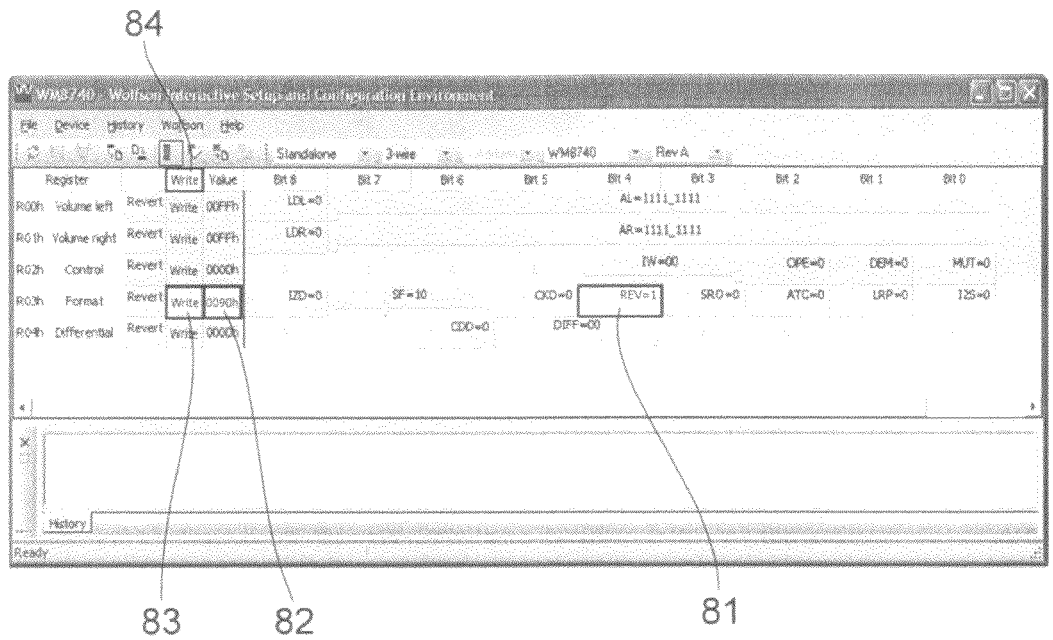
FIGS. 8a and 8b show the interactive register map of FIG. 7 when changing a device setting according to a second aspect of the present invention.
Figure 8B:
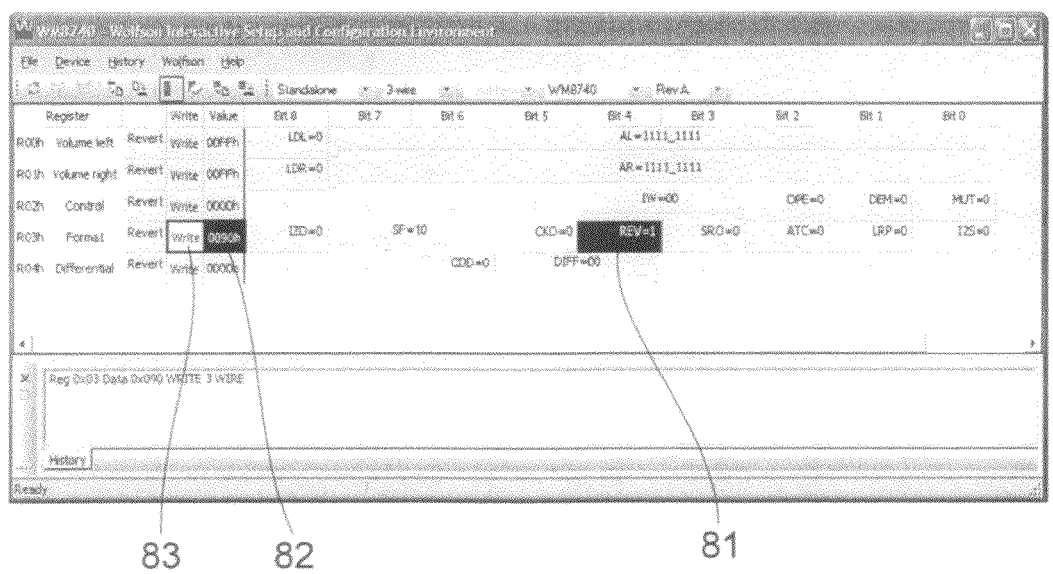

For example, FIGS. 8a and 8b illustrate the steps performed when changing the device setting "REV" in register R03h from "off" (as shown in FIG. 7 as "REV=0") to "on" as shown in FIGS. 8a and 8b (i.e. "REV=1"). Assuming that no other changes are being made to any of the other data fields in register R03h, this involves changing the register value from 0080h (as shown in FIG. 7) to 0090h. This can be accomplished by moving the cursor over the "REV" data field 81 of the interactive register map and selecting this data field (for example by clicking the mouse or pressing the "return" key). According to this aspect of the invention, the data field 81 comprises a secondary indicator for indicating to the user that the device setting is being changed. For example, the background colour of the data field 81 can be changed in response to being clicked by the mouse, for example from a standard colour (such as pale blue) to a different colour (such as yellow). This secondary indicator enables the user to readily identify that the device setting "REV" is in the process of being changed, but not yet written to the control register of the device under test.

In addition to the "REV" data field 81 being changed to show the secondary indicator (i.e. yellow), the area 82 showing the register value can also be changed to show the secondary indicator (i.e. yellow). Furthermore, the area 83 showing the "write" command may also be changed to show the secondary indicator (as may the "write" command shown in area 84). The secondary indicator highlights to a user that the change has not been sent to the device, and also acts to prompt the user to select the "write" command shown in area 83 (or area 84 which is provided for allowing a write command to be performed simultaneously for two or more registers, as discussed later in the application).

Once the new register value has been written to the device under test, for example by clicking the "write" command 83, the background colour of the data field 81 can be changed again (for example to dark blue), indicating that the new value has been written to the device under test. The area 82 corresponding to the register value can also be changed to dark blue, providing a further indication that the register value has changed from its default value.

It will be appreciated that although the preferred embodiment describes the secondary indicator as being a background colour (e.g. pale blue, yellow or dark blue), the secondary indicator could also be some other form of indicator, including, but not limited to, a pattern (such as a cross-hatched or dotted region), a border indicator, a font style or colour, or a flashing indicator.

The secondary indicator has the advantage of providing a clear indication directly relating to whether changes to settings have actually been submitted to the device or are still pending. The second indicator can also be used to indicate whether the register value has been read from the device, or is from a cache (and hence less reliable), and whether the register value is read-write, read-only or write-only.

Figure 9A:
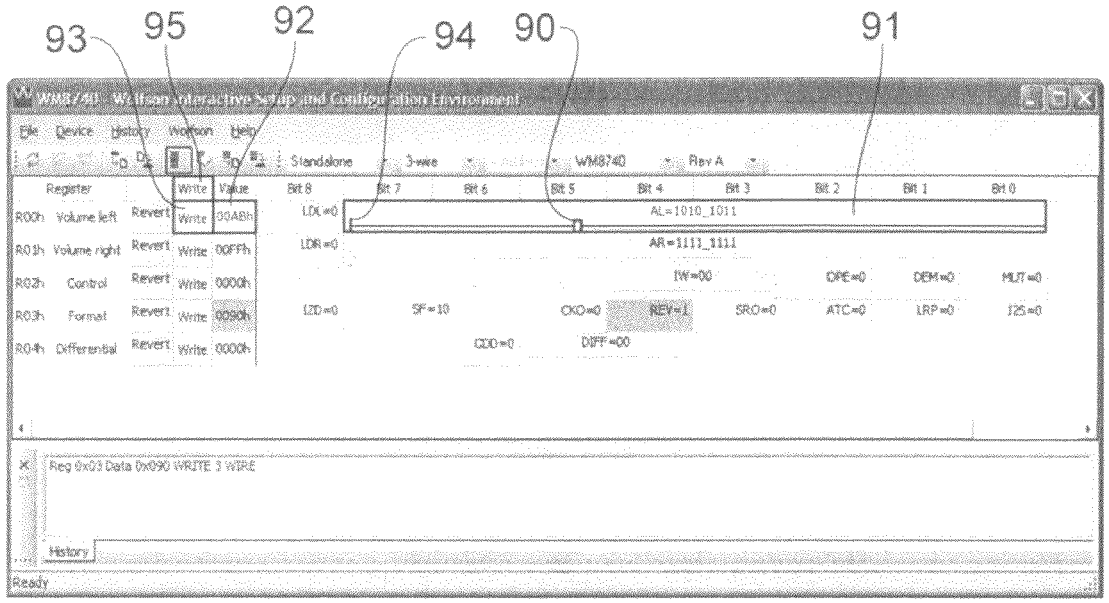
FIGS. 9a, 9b and 9c show the interactive register map of FIG. 7 when changing a device setting according to a third aspect of the present invention.
Figure 9B:
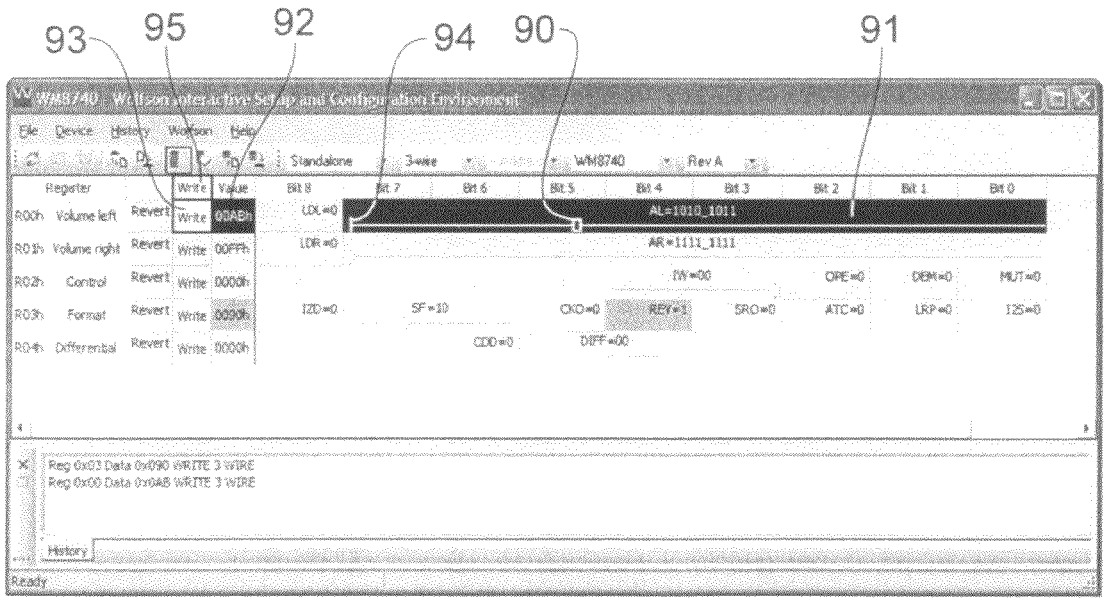
Figure 9C:
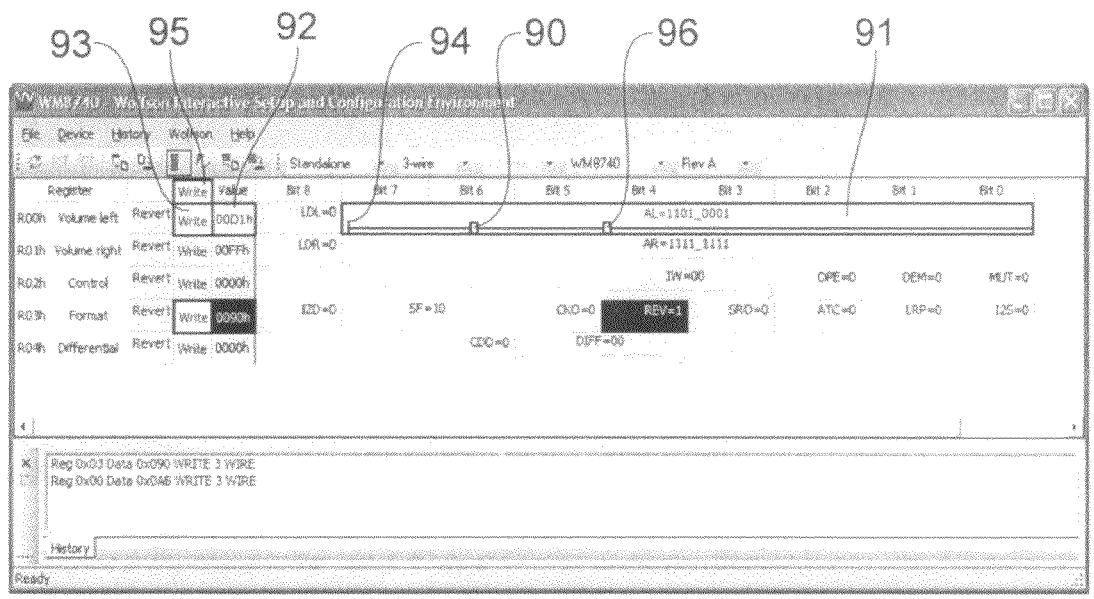

FIGS. 9a, 9b and 9c illustrate the steps performed when changing a device setting that is represented by a slider, for example the "AL" device setting of register R00h (as shown in FIG. 7). This is accomplished by moving the slider setting 90 to the required value. According to this aspect of the invention, the data field 91 comprises a secondary indicator for indicating to the user that the device setting is being changed. For example, the background colour of the data field 91 can be changed in response to the slider setting 90 being moved by the mouse, for example from a standard colour (such as pale blue) to a different colour (such as yellow). This enables the user to readily identify that the device setting "AL" is in the process of being changed, but not yet complete.

In addition to the "AL" data field 91 being changed to yellow, the area 92 corresponding to the register value and/or the area 93 corresponding to the "write" command may also be changed to show the secondary indicator, i.e. yellow. The area 95 corresponding to a "global" write command for several registers may also be changed to show the secondary indicator. The secondary indicator highlights to the user that the change has not been sent to the device, and also acts to prompt the user to select the "write" command 93 (or "write" command 95 if several registers are to be written simultaneously).

According to a further aspect of the invention, the data field 91 comprises a default indicator 94, for showing the default value for that particular data field 91. The default indicator 94 may comprise a default value for that particular data field in the register value that is present following a power-up or reset.

Referring to FIG. 9b, once the new value has been written to the device under test, for example by clicking the area 93 corresponding to the "write" command, the background colour of the data field 91 can be changed again (for example to dark blue), indicating that the new value for this setting has been written to the device under test. The area 92 corresponding to the register value can also be changed to dark blue, providing a further indication that the register value for this setting has changed from its default value. It will be appreciated from FIG. 9b that a user can readily determine that the current setting for the "AL" data field 91 has changed from the default setting, since the slider setting 90 has moved from the default indicator 94.

The default indicator 94 has the advantage of clarifying what the default setting is, and therefore highlights where settings have changed. This has benefits for debugging issues, since it restricts the settings that need to be investigated. It also has the benefits of developing software sequences as it highlights the registers which have been altered to achieve the current state.

Referring to FIG. 9c, this illustrates how the interactive register map operates when making subsequent alterations to the slider setting for data field "AL" 91. FIG. 9c shows that there are now two vertical lines in this data field 91. The first vertical line corresponds to the default indicator 94, i.e. showing the default setting as mentioned in FIGS. 9a and 9b, while a second vertical line 96 shows the current value on the device under test. The first and second vertical lines are preferably shown in a different colour or style, thereby enabling the default setting to be distinguished from the current setting. As above, when the slider setting 90 is moved from the previously selected setting (i.e. the previous "current setting" on the device), the data field 91, the area 92 corresponding to the register value and the area 93 corresponding to the "write" command are turned yellow, thereby indicating that the new slider setting 90 has not yet been written to the device under test. Similarly, the area 95 corresponding to the "global" write command may also be changed yellow. The default indicator 94 indicates to the user that the slider setting 90 is not the default value, and the indicator 96 indicates that the slider setting 90 is not the current value.

When the user clicks on the "write" command 93, the data field 91 and register value 92 will change to a different colour (e.g. dark blue) as indicated in the above example when referring to FIG. 9b.

It will be appreciated that the interactive register map according to the invention provides the user with an enhanced user interface with the numerous advantages mentioned above. In particular, the invention allows the current state of the device to be seen clearly and quickly. The device settings are easy to interpret and update, and it is clear how register bits map to data fields and device settings.

The interactive register map allows all fields to be controlled independently, and enables detailed information to be made available about all registers simultaneously, thus allowing comparisons to be made which are not possible with the prior art. The invention also makes clear which data fields are in the same register and hence will be written simultaneously.

The user can see how the register values map to field settings, since changes made to the value are instantly reflected in the corresponding field settings, and vice versa. The current register values can be read directly, and stored for later retrieval or encoding in control software. Data field settings, for example slider settings, can also be shown in any unit (for example dB or Hz for sample frequency) as the slider is moved.

Updates are made by interacting directly with the representation of the device, providing a consistent metaphor and allowing a very natural interaction. Because the updates are conceptually made directly to the register, and not in separate areas, the user requires fewer steps to achieve the same modifications. A series of write updates can be made in succession, either by a series of individual write sequences, or by having a common "write all" command provided in the register map.

It is noted that register values are physically close to the representation of their fields, thus emphasising the correlation and facilitating cross-referencing.

It is also noted that each register in the interactive register map can be identified by its address and/or name. Furthermore, the address and data values can be provided in hexadecimal, decimal, binary or any other suitable format.

Although the preferred embodiments refer to toggle buttons for representing single-bit data fields, and slider switches, list boxes or drop-down menus for representing multiple-bit data fields, it will be appreciated that other forms of indicators can also be used.

In addition, it is noted that more detailed information can be provided to the user via tool-tips, which appear when hovering the mouse over an area of the interactive register map.

In addition to the various indicators described in the preferred embodiments, it is also noted that the apparatus may provide a further indicator that is only displayed to selected users, for example the manufacturer of the device under test. This may be provided in situations where certain bits are provided as "internal testing bits" only, which are not documented to customers. The further indicator may be displayed by way of a different aspect such as font to the selected users, for example in italic font, and not displayed at all to other users.

According to a further aspect of the invention, a history of operations can be provided, as shown for example at the bottom of FIGS. 9a, 9b and 9c. The history of operations can be used for developing software. The history can be saved and replayed at a later date, allowing a series of steps to be reproduced, which is useful for developing set-up sequences or debugging problems.

According to yet a further aspect, an error indicator can be provided to show that there has been an error accessing a register. The error indicator can be in the form of a background colour, for example "red", in the relevant data field.

A further indicator may also be provided to associate registers by task. This takes the basic concepts described above and adds further information about the category of each register value and field of the device. For example, clocking fields can be shown in one colour, interface control fields in another colour, volume control fields in a third colour, etc. The same convention of using a darker/lighter hue to indicate a non-default value (as described in the above-mentioned embodiments) can also be used with these additional colours. Once again, it will be appreciated that the references made above to different colours is also intended to include other forms of indicators, such as different fonts, different styled borders, etc.

The apparatus for monitoring and controlling the device under test is further provided with a device descriptor. The device descriptor works in conjunction with the interactive register map, such that the apparatus can be used with any device under test, without requiring the whole software to be rewritten. The device descriptor comprises a data file containing information about the device under test. For example, the data file may comprise:

- general information relating to the device (for example ID/name, revision level, reported ID, supported control interfaces and interface formats, number of bits per register),
- information relating to the specific registers themselves (for example register: name; index/address; description; default value; register access type; other flags),
- information relating to each data field (for example: start/end bits; name; description; default value; field access; other flags), and
- data field format (for example describing whether a data field is represented by a toggle switch, slider, drop-down menu, etc)

Having this information in the device descriptor means that adding support for a new device only requires the writing of a new device descriptor and adding this to the set of descriptors available to the software (without requiring any modifications to the software that controls the interactive register map per se).

According to a further aspect of the invention, there is provided a computer program for performing a method as claimed in the embodiments above. The invention also relates to a computer-readable medium comprising such a computer program.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

What is claimed is:

1. A method of monitoring and controlling a device under test, the device under test comprising a plurality of registers, each register having a register value and comprising a plurality of data bits for controlling a setting or settings of the device under test, the method comprising the steps of:
   displaying an interactive register map to a user, wherein the interactive register map is configured to display a plurality of register values simultaneously, and wherein the register map is further adapted to display one or more data fields corresponding to each register value, each data field relating to one or more of the data bits and having a first indicator for representing a corresponding device setting.

2. A method as claimed in claim 1, wherein a data field comprises a single data bit, and wherein the first indicator comprises a toggle button for representing a device setting having first and second states that are controlled by the single data bit.

3. A method as claimed in claim 1, wherein a data field comprises two or more data bits, and wherein the first indicator comprises a slider device for representing a device setting having variable states that are controlled by the two or more data bits.

4. A method as claimed in claim 1, wherein a data field comprises two or more data bits, and wherein the first indicator comprises a drop down menu device for representing a device setting having one of a predetermined number of states, the predetermined number of states being controlled by the two or more data bits.

5. A method as claimed in claim 1, wherein a data field having a data bit that is not used for controlling a device setting is provided with a null indicator.

6. A method as claimed in claim 1, wherein a data field is provided with a secondary indicator, the secondary indicator indicating that the corresponding device setting is in the process of being changed, but not written to the register of the device under test.

7. A method as claimed in claim 1, further comprising a third indicator, the third indicator indicating whether a data field is read-only, read-write or write-only.

8. A method as claimed in claim 1, wherein a data field comprises a default indicator for indicating the default value for that data field.

9. A method as claimed in claim 8, wherein the default indicator represents a default value for the data field which is held in a register after a power-up or reset.

10. A method as claimed in claim 1, further comprising a fourth indicator for indicating that the data field is displayed to selected users only.

11. A method as claimed in claim 6, wherein the respective secondary indicator, third indicator, fourth indicator or default indicator comprises a background colour, border, pattern or font in the corresponding data field.

12. A method as claimed in claim 1, wherein the register value is represented as a hexadecimal, decimal or binary value.

13. A method as claimed in claim 1, wherein a register is identified using a name identifier.

14. A method as claimed in claim 1, further comprising the step of displaying a text descriptor to a user as a cursor is hovered over a data field or register value.

15. A method as claimed in claim 1, further comprising the step of updating a register value by interacting with the displayed register map.

16. A method as claimed in claim 15, wherein the updating step comprises editing a text field corresponding to a data field.

17. A method as claimed in claim 15, wherein the updating step comprises selecting a button to toggle a data field representing a single data bit.

18. A method as claimed in claim 15, wherein the updating step comprises moving a slider mechanism, the slider mechanism corresponding to a data field representing a plurality of data bits.

19. A method as claimed in claim 15, wherein the updating step comprises the step of activating a pull down menu, and selecting an entry from the pull down menu.

20. A method as claimed in claim 15, wherein the updating step comprises the step of preparing a sequence of register writes, and submitting the register writes for execution in succession.

21. A method as claimed in claim 20, wherein the register writes are submitted individually.

22. A method as claimed in claim 20, wherein the register writes are submitted together using a common write command.

23. A method as claimed in claim 1, further comprising the step of providing a history of operations performed on the interactive register map.

24. A method as claimed in claim 1, further comprising the step of providing a device descriptor for enabling the apparatus to be used with any device under test, without requiring the whole software to be rewritten.

25. Apparatus for monitoring and controlling a device under test, the device under test comprising a plurality of registers, each register having a register value and comprising a plurality of data bits for controlling a setting or settings of the device under test, the apparatus comprising:
a display for displaying an interactive register map to a user, wherein the interactive register map is configured to display a plurality of register values simultaneously, and wherein the register map is further adapted to display one or more data fields corresponding to each register value, each data field relating to one or more of the data bits and having a first indicator for representing a corresponding device setting.

26. An apparatus as claimed in claim 25, wherein a data field comprises a single data bit, and wherein the first indicator comprises a toggle button for representing a device setting having first and second states that are controlled by the single data bit.

27. An apparatus as claimed in claim 25, wherein a data field comprises two or more data bits, and wherein the first indicator comprises a slider device for representing a device setting having variable states that are controlled by the two or more data bits.

28. An apparatus as claimed in claim 25, wherein a data field comprises two or more data bits, and wherein the first indicator comprises a drop down menu device for representing a device setting having one of a predetermined number of states, the predetermined number of states being controlled by the two or more data bits.

29. An apparatus as claimed in claim 25, wherein a data field having a data bit that is not used for controlling a device setting is provided with a null indicator.

30. An apparatus as claimed in claim 25, wherein a data field is provided with a secondary indicator, the secondary indicator indicating that the corresponding device setting is in the process of being changed, but not written to the register of the device under test.

31. An apparatus as claimed in claim 25, wherein the display means is adapted to provide a third indicator for indicating whether a data field is read-only, read-write or write-only.

32. An apparatus as claimed in claim 25, wherein the display means is adapted to display a default indicator corresponding to a data field, the default indicator indicating the default value for that data field.

33. An apparatus as claimed in claim 32, wherein the default indicator represents a default value for the data field that is held in a register after a power-up or reset.

34. An apparatus as claimed in claim 25, wherein the display means is adapted to provide a fourth indicator for indicating that the data field is displayed to selected users only.

35. An apparatus as claimed in claim 30, wherein the respective secondary indicator, third indicator, fourth indicator or default indicator comprises a background colour, border, pattern or font in the corresponding data field.

36. An apparatus as claimed in claim 25, wherein the display means is adapted to display a register value as a hexadecimal, decimal or binary value.

37. An apparatus as claimed in claim 25, wherein the display means is adapted to identify a register using a name identifier.

38. An apparatus as claimed in claim 25, wherein the display means is further adapted to display a text descriptor to a user when a pointing device is moved over a data field or register value.

39. An apparatus as claimed in claim 25, wherein a register value is updated by interacting with the displayed interactive register map.

40. An apparatus as claimed in claim 39, wherein the register value is updated by editing a text field corresponding to a data field.

41. An apparatus as claimed in claim 39, wherein the register value is updated by selecting a toggle button, the toggle button representing a data field having a single data bit.

42. An apparatus as claimed in claim 39, wherein the register value is updated by moving a slider mechanism, the slider mechanism corresponding to a data field having a plurality of data bits.

43. An apparatus as claimed in claim 39, wherein the register value is updated by activating a pull down menu, and selecting an entry from the pull down menu.

44. An apparatus as claimed in claim 39, wherein two or more register values are updated by preparing a sequence of register writes, and submitting the register writes for execution in succession.

45. An apparatus as claimed in claim 44, wherein the register writes are performed using a series of individual commands.

46. An apparatus as claimed in claim 44, wherein the register writes are performed together using a common write command.

47. An apparatus as claimed in claim 25, wherein the display means is adapted to display a history of operations performed on the interactive register map.

48. An apparatus as claimed in claim 25, further comprising a device descriptor for enabling the apparatus to be used with any device under test, the device descriptor comprising a data file for associating parameters of the device under test with parameters of the monitoring and control apparatus.

49. A computer program for performing a method as claimed in claim 1.

50. A computer-readable medium comprising a computer program as claimed in claim 49.

* * * * *